United States Patent [19]
Asazawa

[11] Patent Number: 5,177,449
[45] Date of Patent: Jan. 5, 1993

[54] RADIO FREQUENCY AMPLIFIER CIRCUIT
[75] Inventor: Hiroshi Asazawa, Tokyo, Japan
[73] Assignee: NEC Corporation, Tokyo, Japan
[21] Appl. No.: 835,327
[22] Filed: Feb. 14, 1992
[30] Foreign Application Priority Data
  Feb. 15, 1991 [JP] Japan .................. 3-021770
[51] Int. Cl.⁵ .......................... H03F 3/45; H03L 7/00
[52] U.S. Cl. ................................ 330/252; 330/117;
  330/148; 330/301; 331/8; 331/25
[58] Field of Search ............... 330/252, 257, 261, 275,
  330/301, 117, 148; 331/8, 25; 455/260
[56] References Cited
  U.S. PATENT DOCUMENTS
  4,292,597  9/1981  Niimura et al. ............... 330/301

OTHER PUBLICATIONS

I. Kipnis et al., "Silicon Bipolar Fixed and Variable . . . Applications up to 6 GHz", 1989 IEEE MTT-S Digest, pp. 109-112.
Hans-Martin Rein, "Multi-Gigabit-Per-Second Silicon Bipolar . . . Transmission Systems", IEEE Journal of Solid-State Circuits, vol. 23, No. 3, Jun. 1988, pp. 664-675.

Primary Examiner—James B. Mullins
Attorney, Agent, or Firm—Sughrue, Mion, Zinn, Macpeak & Seas

[57] ABSTRACT

A radio frequency amplifier comprises a differential amplifier having a pair of differential first and second transistors and a first and a second load resistor; an emitter grounded amplifier having a third transistor and a third load resistor; and a reference voltage generator having a constant-current source formed by a fourth transistor and a fourth load resistor. The emitter grounded amplifier receives a high frequency input signal and outputs a single signal output. One input node of the differential amplifier receives the output from the emitter grounded amplifier and the other input node receives a reference voltage from the reference voltage generator. The third and fourth transistors form a current-mirror circuit. The DC bias voltages of the two input nodes of the differential amplifier are set to have the same value by an appropriate selection of the ratio between the currents flowing in the third and fourth transistors and also the ratio between the resistance values of the third and fourth load resistors. This arrangement enables to divide a high frequency input signal into a single signal output and differential signal outputs.

7 Claims, 4 Drawing Sheets

RADIO FREQUENCY AMPLIFIER CIRCUIT

BACKGROUND OF THE INVENTION (1) Field of the Invention

The present invention relates to an amplifier circuit, and more particularly to a radio frequency amplifier circuit (hereinafter referred to as an "RF amplifier circuit") for dividing a radio frequency input signal into an analog and a differential radio frequency output signal.

(2) Description of the Related Art

A conventional RF amplifier circuit has a circuit configuration, as shown in FIG. 1, wherein a single input signal is amplified at an input stage consisting of an emitter grounded transistor 21 and an output stage consisting of self-biased Darlington-connected pair transistors 22, 23 with local shunt and series feedback. Another conventional RF amplifier circuit has a circuit configuration, as shown in FIG. 2, wherein an input signal is amplified by Darlington-connected pair transistors 22', 23' with resistive bias network and shunt and series resistive feedback. Such circuits are disclosed in, for example, the "SILICON BIPOLAR FIXED AND VARIABLE GAIN AMPLIFIER MMICs FOR MICROWAVE AND LIGHTWAVE APPLICATIONS UP TO 6 GHz", 1989 IEEE MTT-S Digest, Pages 109–112. Generally, where an RF amplifier circuit is constituted by discrete elements, in order to bring out the characteristics of the transistors used to their maximum extent, it is usual for the input-output terminals to be provided with matching circuits which match the input-output impedances of the transistor circuit. The circuits shown in FIGS. 1 and 2 are ones in which a self-biasing method is applied and a negative feedback technique is provided so as to be suited in the realization of LSIs.

Further, an example of a conventional circuit which is more suited to the realization of LSIs is a differential amplifier circuit, as shown in FIG. 3, wherein two input signals processed by two-stage emitter follower circuits 25, 27 and 26, 28, respectively, are amplified by a differential amplifier circuit formed by a pair of differential transistors 1, 2, a constant-current source 3 and load resistors 4, 5. This circuit is disclosed in the "Multi-Gigabit-Per-Second Silicon Bipolar IC's for Future Optical-Fiber Transmission Systems", IEEE Journal of Solid-State Circuits, Vol. 23 No. 3 June, 1988, Pages 664–675. This kind of differential amplifier circuit is widely used in LSIs because the characteristics of the differential pair transistors 1 and 2 can be coincided with each other.

As a specific example wherein a single input signal and a differential input signal are used in combination, FIG. 4 shows a frequency converter using a phase-locked loop (PLL) synthesizer. There is provided a PLL loop which is formed by having an output signal of a voltage controlled oscillator (VCO) 10 dividedly inputted to a frequency divider (DIV) 12 and to a local amplifier 16 through a buffer 11 and an attenuator 41 and which feeds back an output of the frequency divider 12 to the voltage controlled oscillator (VCO) 10 as a control signal by a frequency-phase comparator or phase detector (PFD) 14. A local signal (LOCAL) from the local amplifier 16 is supplied to a mixer 15 to which an RF signal is also inputted and which outputs an intermediate frequency signal (IF) in the receiver system. Generally, in the ICs, the above frequency divider (DIV) 12 is realized by a differential circuit and the local amplifier 16 is realized by a single-input amplifier circuit of an emitter grounded type. In order to realize the above overall arrangement by use of discrete elements, the attenuator 41 consisting of a resistor network as shown in FIG. 4 is normally used.

In each of the conventional amplifier circuits shown in FIGS. 1–3, it is possible to obtain only either a single output or a differential output. Therefore, it is necessary to have the signal divided into two kinds of signals for forming the system as shown in FIG. 4, which requires a discrete circuit to be provided externally of the IC, resulting in a characteristic problem of causing the attenuation of signals due to the presence of the divider circuit. This is a problem to be solved in the conventional circuits.

Further, the amplifiers may possibly be formed all in a semiconductor integrated circuit since such circuits are based on a differential circuit suited to LSIs. However, the problem therein is that, since the power efficiency is inferior so that, if a desired output power is to be obtained through low impedance line, for example, 50 Ω transmission line, the current consumption is larger than in the amplifier circuit dealing with a single signal. This is another problem to be solved in the conventional circuits.

SUMMARY OF THE INVENTION

It is, therefore, an object of the invention to overcome the problems existing in the conventional amplifier circuit and to provide an improved RF amplifier circuit.

It is another object of the invention to provide an RF amplifier circuit in which an external discrete circuit is not necessary and the power consumption is effectively reduced.

According to one aspect of the invention, there is provided an RF amplifier circuit which comprises:

a differential amplifier having a first transistor and a second transistor whose emitters are connected with each other and whose collectors are respectively connected to a first output terminal and a second output terminal, a first constant-current source connected between a ground and the common emitters of the first and second transistors, and a first load resistor and a second load resistor respectively connected to collectors of the first and second transistors;

an emitter grounded amplifier having a third transistor whose emitter is grounded, whose base is connected to an input terminal to which an input signal is applied, and whose collector is connected to a third output terminal and also connected to a base of the first transistor, and a third load resistor connected to the collector of the third transistor; and a reference voltage generating circuit having a second constant-current source and a fourth load resistor, whose output is connected to a base of the second transistor, whereby differential signal outputs are outputted from the first and second output terminals and a single signal output is outputted from the third output terminal.

According to the present invention, one of the input nodes of the differential amplifier circuit is provided with an emitter grounded amplifier circuit which includes a transistor and a load resistor and the other of the input nodes is provided with a reference voltage generating circuit which includes a constant-current source forming a current-mirror with respect to the transistor in the emitter grounded amplifier, and a load resistor.

BRIEF DESCRIPTION OF THE DRAWINGS

The above and other objects, features and advantages of the present invention will be apparent from the following description of a preferred embodiment of the invention, with reference to the accompanying drawings, in which.

PREFERRED EMBODIMENTS OF THE INVENTION

Now, preferred embodiments of the invention will be explained with reference to the accompanying drawings. It should be noted that, throughout the following explanation, similar reference symbols or numerals refer to the same or similar elements in all the figures of the drawings.

Figure 5:
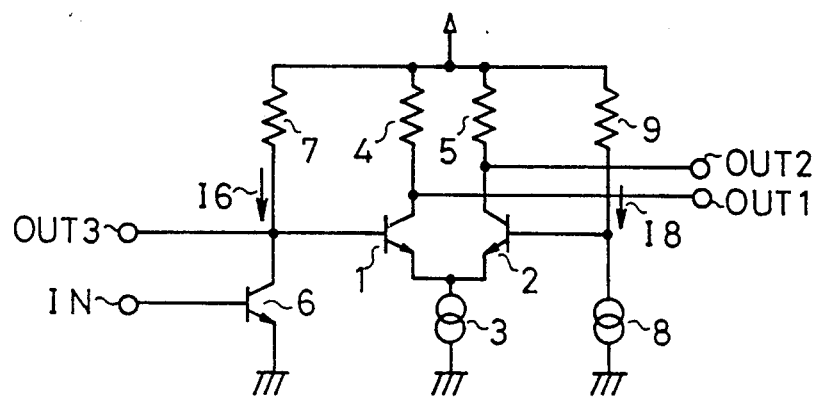
FIG. 5 is a circuit diagram showing an RF amplifier circuit of an embodiment according to the present invention.

FIG. 5 is a circuit diagram showing an embodiment according to the present invention. A differential amplifier circuit is formed by a pair of differential transistors 1, 2, a constant-current source 3, and load resistors 4, 5. To one input node of the differential amplifier circuit is connected an output of an emitter grounded amplifier circuit which is formed by a transistor 6 and a load resistor 7. To the other input node thereof is connected an output of a reference voltage generating circuit which is formed by a constant-current source 8 and a load resistor 9.

Now, assuming that the DC bias current of the transistor 6 is I6, the resistance value of the load resistor 7 is R7, the current value of the constant-current source 8 is I8, and the resistance value of the load resistor 9 is R9, the respective DC bias points of the two inputs of the differential amplifier circuit equal each other if the selection on the respective values is made to satisfy the following equation (1):

$$I6 \cdot R7 = I8 \cdot R9 \qquad (1)$$

Under the condition where the above equation is satisfied, if an AC signal is applied to the base of the transistor 6, the base signal of the transistor 1 of the differential amplifier takes the form in which the AC signal component overlaps on the same DC operation point as that of the base of the transistor 2, so that the differential outputs of in-phase and opposite-phase can be obtained respectively at the collectors of the differential transistors 2 and 1 and outputted from output terminals OUT2 and OUT1.

Figure 1:
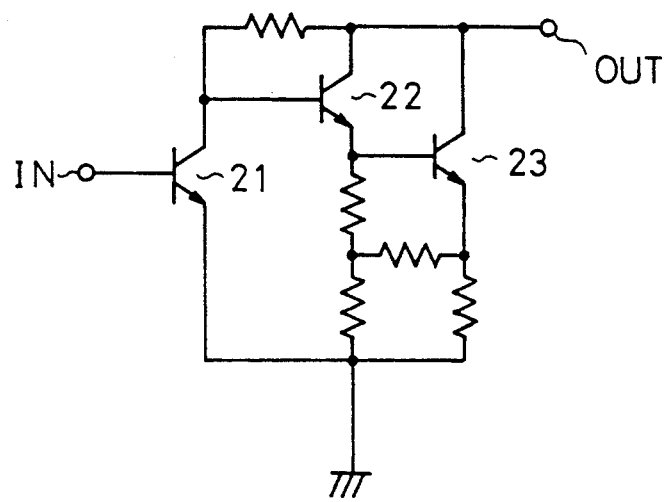
FIGS. 1-3 are circuit diagrams respectively showing conventional RF amplifier circuits.
Figure 2:
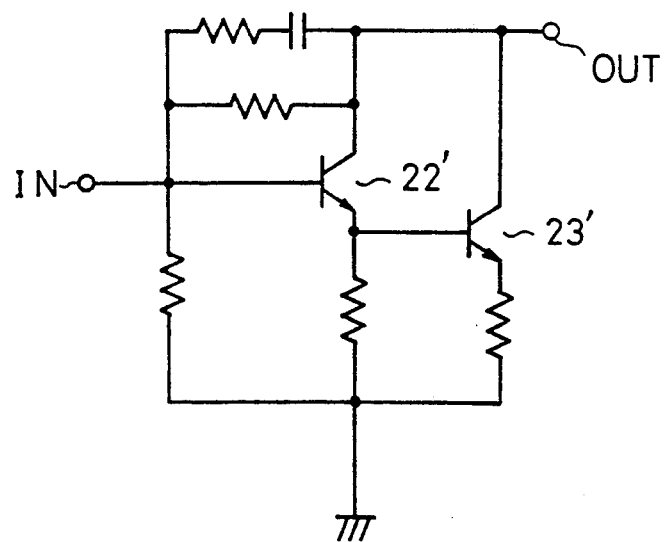
Figure 3:
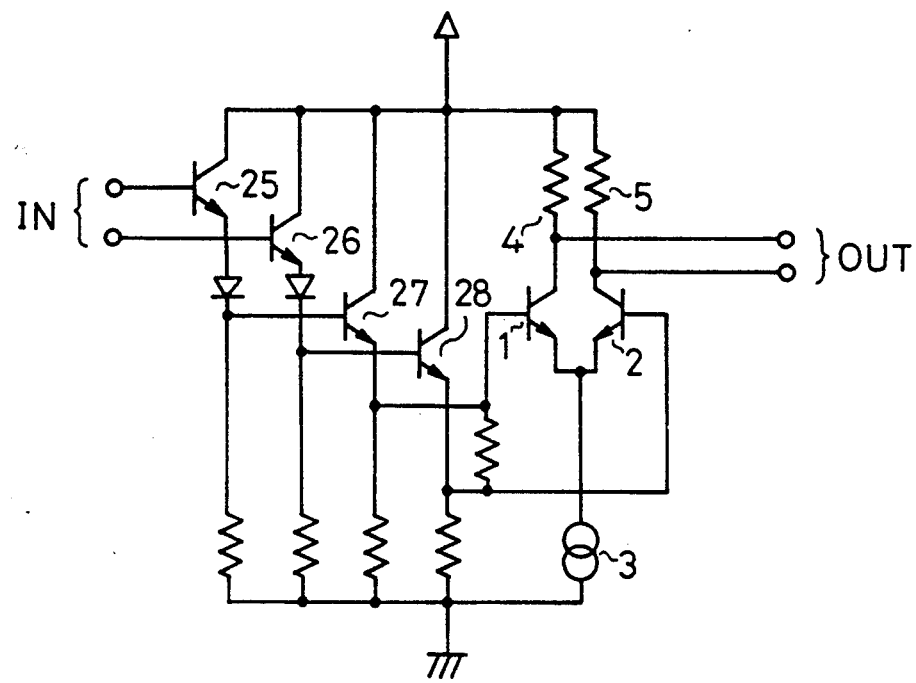
Figure 4:
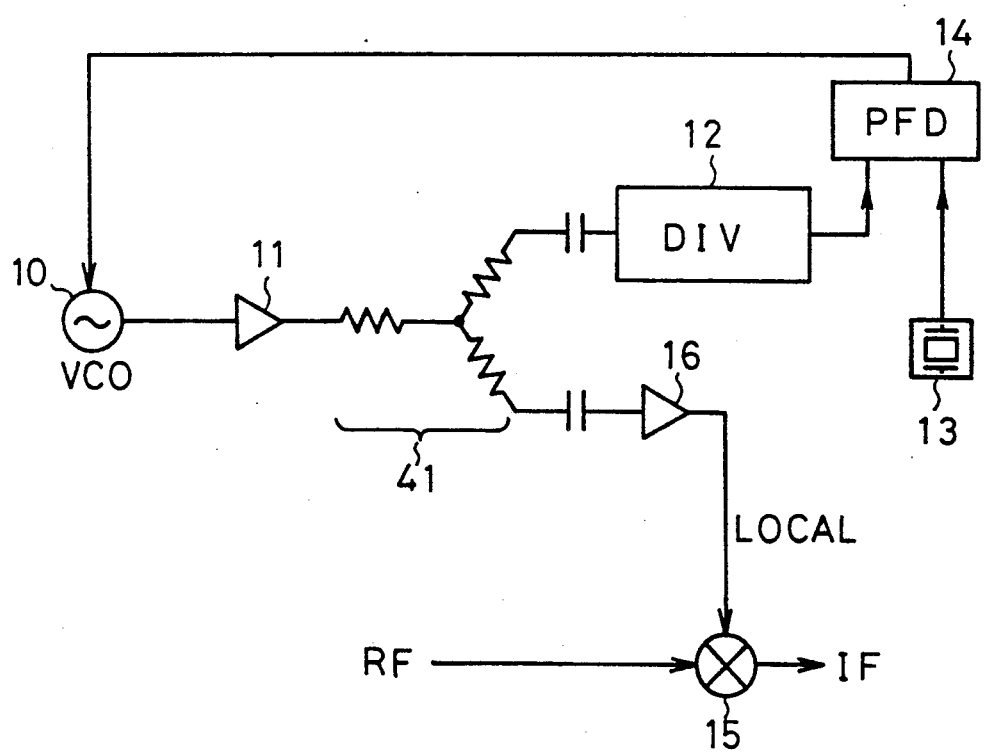
FIG. 4 is a block diagram showing a conventional frequency converter.
Figure 6:
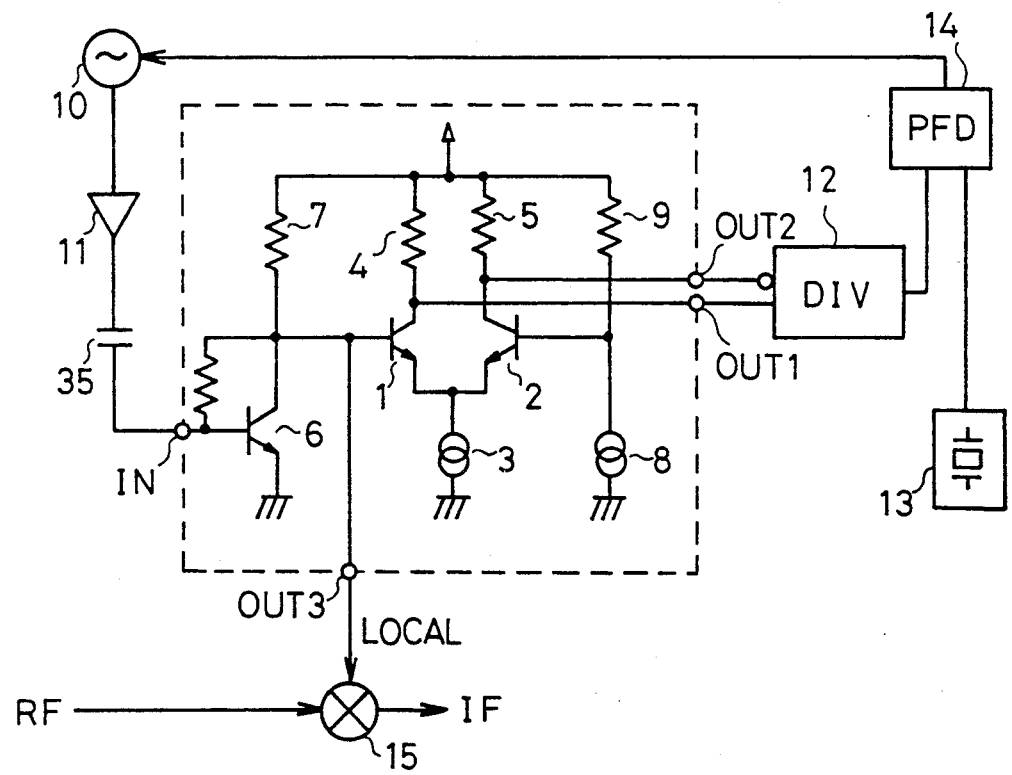
FIG. 6 is a circuit diagram of a circuit in which an RF amplifier circuit of the invention is embodied.

FIG. 6 shows a frequency converter using a PLL synthesizer in which the RF amplifier circuit according to the invention is embodied and which is equivalent to the conventional frequency converter shown in FIG. 4. The frequency converter is formed by a mixer 15 and a PLL frequency synthesizer which includes a voltage controlled oscillator (VCO) 10, a frequency divider (DIV) 12, a reference signal oscillator 13 and a frequency-phase detector (PFD) 14.

The frequency divider 12 is generally realized by an IC having a differential logic circuit configuration such as an ECL circuit. The mixer 15 is a circuit which mixes the local signal (LOCAL) forwarded from the voltage controlled oscillator (VCO) 10 and a radio frequency signal (RF) and outputs an intermediate frequency signal (IF). With the conversion gain or the power consumption being taken into consideration, the mixer 15 is usually realized by an emitter grounded type amplifier circuit rather than a differential type configuration. In such a case, if the RF amplifier circuit according to the present invention is used, as shown in FIG. 6, the signal from the voltage controlled oscillator (VCO) 10 can readily be divided into two signals, one being a differential signal to be forwarded to a prescaler and the other being a single local signal (LOCAL) to be forwarded to the mixer 15. This is an advantage over the conventional frequency converter shown in FIG. 4 from the two aspects, one from the circuit structure which eliminates the need of pads for dividing purpose and the other from the reduction in the power consumption, and these can readily be realized in a single LSI.

Figure 7:
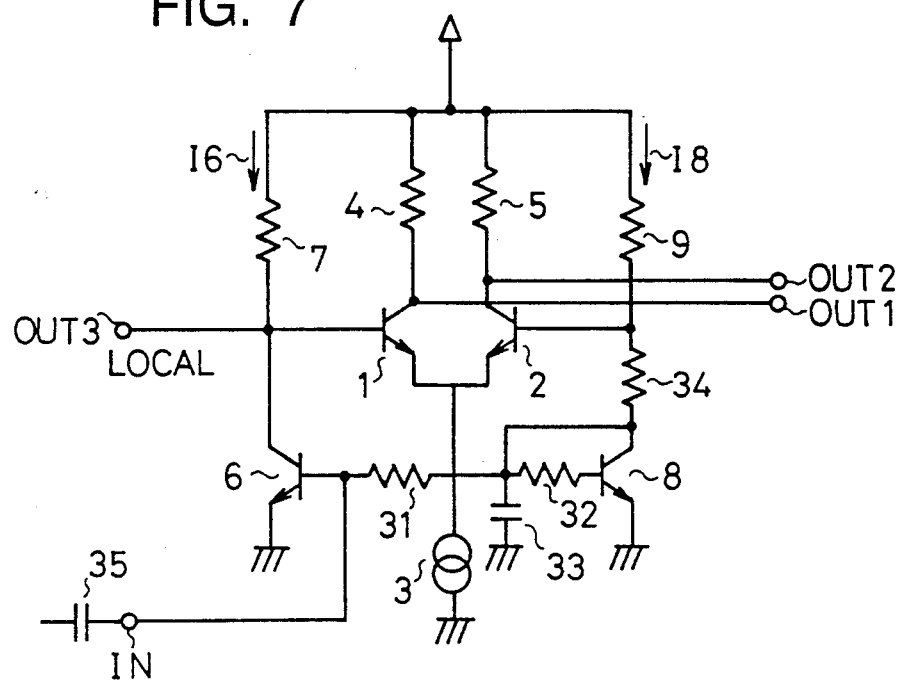
FIG. 7 is a detailed circuit diagram of the RF amplifier circuit of the invention shown in FIG. 5.

FIG. 7 shows a more detailed circuit diagram of the embodiment according to the invention.

A transistor 8 operates as the constant-current source and the current value is determined by the resistance values of the resistors 9 and 34. Since the transistor 6 and the transistor 8 form a current-mirror circuit, the appropriate selection of the resistance values of the base resistors 31, 32, the sizes of the transistors 6, 8, and the resistance values of the load resistors 7, 9 enables to equalize the DC bias voltages of the bases of the differential transistors 1 and 2.

A capacitor 33 connected between a junction node of the base resistors 31, 32 and the ground is a by-pass capacitor to the ground, which prevents the AC signal to be applied only to the base of the transistor 6 from being leaked to the current source transistor 8.

Figure 8:
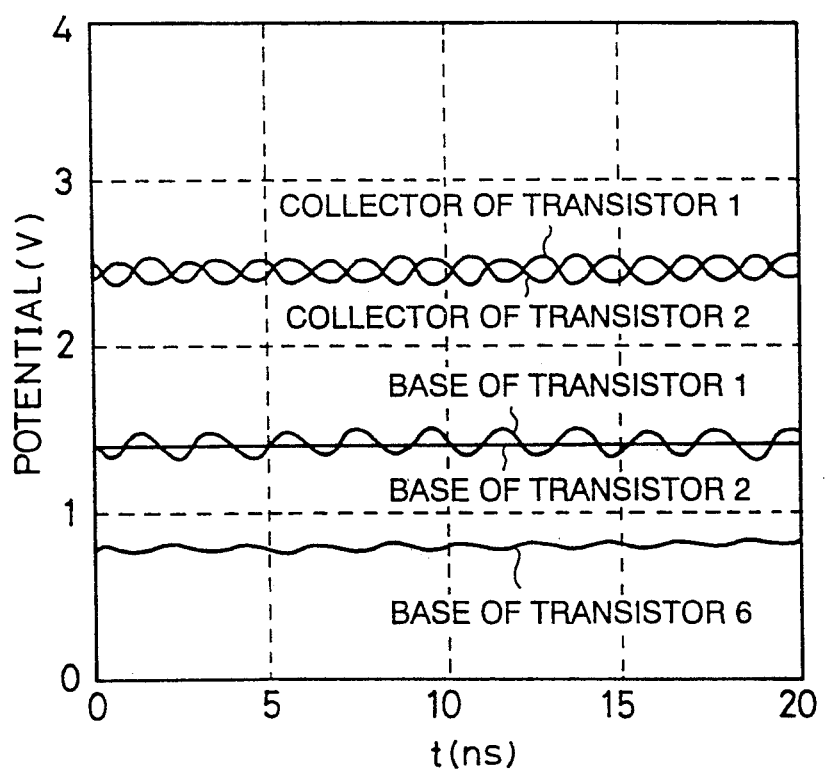
FIG. 8 is a graph showing operation waveforms.

The AC signal applied to the base of the transistor 6 through a coupling capacitor 35 is amplified and outputted to the collector of the transistor 6 as the local signal (LOCAL) which is forwarded to the mixer 15 from an output terminal OUT3. The output of this emitter grounded transistor 6 is also applied to the base of the transistor 1 whose DC bias voltage is fixed to the same as that of the transistor 2 to the base of which a reference voltage is applied, so that differentially amplified signals are obtained at the collectors of the transistors 1 and 2 and outputted from the output terminals OUT1 and OUT2. Operation waveforms are shown in FIG. 8.

As has been explained hereinabove, according to the present invention, since one of the input nodes of a differential amplifier is provided with the reference voltage generating circuit and the other of the input nodes thereof is provided with the emitter grounded amplifier circuit which has the same DC bias voltage as that in the output voltage of the reference voltage generating circuit, it is possible to divide a single signal input into a single amplified output and a differential output. In this way, the present invention enables with one and simple circuit the realization of a differential output directed to a frequency divider and a single output directed to a mixer in such transmission system as a receiver composed of a PLL frequency synthesizer and a mixer. The circuit according to the present invention is especially suited to be fabricated in LSIs.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An amplifier circuit comprising:
   a differential amplifier having a first transistor and a second transistor whose emitters are connected with each other and whose collectors are respectively connected to a first output terminal and a second output terminal, a first constant-current source connected between a ground and the common emitters of said first and second transistors, and a first load resistor and a second load resistor respectively connected to collectors of said first and second transistors;
   an amplifier having a third transistor whose emitter is grounded, whose base is connected to an input terminal to which an input signal is applied, and whose collector is connected to a third output terminal and also connected to a base of said first transistor, and a third load resistor connected to the collector of said third transistor; and
   a reference voltage generating circuit having a second constant-current source and a fourth load resistor, whose output is connected to a base of said second transistor,
   whereby differential signal outputs are outputted from said first and second output terminals and a single signal output is outputted from said third output terminal.

2. An amplifier circuit according to claim 1, in which said second constant-current source is formed by a fourth transistor having its base and collector electrically connected together, and said third transistor and said fourth transistor have their bases coupled with each other so as to form a current-mirror circuit, the voltage drop across said third load resistor to be caused by a collector current of said third transistor being set to be the same as the voltage drop across said fourth load resistor to be caused by a collector current of said fourth transistor.

3. An amplifier circuit according to claim 2, further comprising a first and a second coupling resistor connected in series between the bases of said third and fourth transistors, and a by-pass capacitor connected between a common junction node of said first and second coupling resistors and the ground for preventing said input signal applied to the base of said third transistor from being leaked to the base of said fourth transistor.

4. An amplifier circuit according to claim 2, in which said first through fourth transistors are all bipolar transistors of an NPN-type.

5. A frequency converter comprising:
   an amplifier circuit having:
      a differential amplifier having a first transistor and a second transistor whose emitters are connected with each other and whose collectors are respectively connected to first and second output terminals for outputting differential signal outputs, a first constant-current source connected between a ground and the common emitters of said first and second transistors, and a first load resistor and a second load resistor respectively connected to collectors of said first and second transistors.
      an amplifier having a third transistor whose emitter is grounded, whose base is connected to an input terminal to which a high frequency signal is applied, and whose collector is connected to a third output terminal for outputting a single signal output and also connected to a base of said first transistor, and a third load resistor connected to the collector of said third transistor, and
      a reference voltage generating circuit having a second constant-current source and a fourth load resistor, whose output is connected to a base of said second transistor;
   a voltage controlled oscillator for outputting said high frequency signal applied to the base of said third transistor;
   a frequency divider for receiving differential signal outputs from said first and second output terminals of said amplifier circuit; and
   a phase detector for comparing an output from said frequency divider with a reference signal and for outputting a control signal applied through a feedback loop to a voltage control terminal of said voltage controlled oscillator.

6. A frequency converter according to claim 5, in which said second constant-current source is formed by a fourth transistor having its base and collector electrically connected together, and said third transistor and said fourth transistor have their bases coupled with each other so as to form a current-mirror circuit, the voltage drop across said third load resistor to be caused by a collector current of said third transistor being set to be the same as the voltage drop across said fourth load resistor to be caused by a collector current of said fourth transistor.

7. A frequency converter according to claim 6, in which said amplifier circuit further comprises a first and a second coupling resistor connected in series between the bases of said third and fourth transistors, and a by-pass capacitor connected between a common junction node of said first and second coupling resistors and the ground for preventing said input signal applied to the base of said third transistor from being leaked to the base of said fourth transistor.

* * * * *